United States Patent [19] [11] 4,181,964
Moore et al. [45] Jan. 1, 1980

[54] INTEGRATED ELECTRONICS ASSEMBLY ON A PLASTIC CHASSIS

[75] Inventors: James H. Moore; Gene D. Lee, both of Dallas, Tex.

[73] Assignee: Texas Instruments Incorporated, Dallas, Tex.

[21] Appl. No.: 592,443

[22] Filed: Jul. 2, 1975

[51] Int. Cl.² .......................... G06F 3/00; H01H 13/02
[52] U.S. Cl. ................................. 364/708; 200/5 A; 361/399
[58] Field of Search .................. 235/156, 152, 145 R; 200/5 R, 5 A, 5 E; 317/99, 101 A, 101 B, 101 C, 101 CE; 340/365 R; 29/589, 591, 577; 361/331, 390, 397, 399, 400–402; 364/708

[56] References Cited

U.S. PATENT DOCUMENTS

| 3,705,276 | 12/1972 | Seegar, Jr. et al. | 200/5 A |
| 3,743,797 | 7/1973 | Hoffman | 200/5 R |
| 3,823,309 | 7/1974 | Caruso | 200/5 A |
| 3,843,851 | 10/1974 | Harada et al. | 200/5 E |
| 3,860,771 | 1/1975 | Lynn et al. | 200/5 R |
| 3,886,335 | 5/1975 | Hendricks | 200/5 A |
| 3,911,234 | 10/1975 | Kotaka | 200/5 A |
| 3,982,081 | 9/1976 | Demler, Jr. | 200/5 R |

OTHER PUBLICATIONS

Anglin et al.; Unitary Plastic Keylever System; IBM Technical Disclosure Bulletin; vol. 10, No. 12, May 1968; p. 1844.

Primary Examiner—Errol A. Krass
Attorney, Agent, or Firm—James T. Comfort; Rene' E. Grossman; Stephen S. Sadacca

[57] ABSTRACT

The invention defines a technique for assemblying all the parts of an electronic unit, for example a hand held calculator, directly on a plastic chassis without using individual printed circuit boards for various circuits of the calculator. Such parts of the calculator as the calculator chip, the display and the keyboard are all mounted on or formed on the plastic chassis in such a manner that only a cover has to be put over the plastic chassis to complete the calculator.

11 Claims, 4 Drawing Figures

INTEGRATED ELECTRONICS ASSEMBLY ON A PLASTIC CHASSIS

This invention relates to an integrated electronic assembly on a plastic chassis and more particularly to an electronic circuit which is formed on the lower part of the plastic case instead of using individual circuit boards.

IN PRIOR ART

Most calculators are made with one or more printed circuit boards containing the electronics, a separate keyboard, and a separate printed circuit board for the display. Some designs combine a printed circuit board with the key switch board. In either case the electronic assembly is made with conventional procedures such as automatic insertion of in-line components and hand insertion of special components. The components usually are wave soldered, hand soldered or dip soldered, to attach the components to the printed circuit boards.

Multiple switch devices have been formed on a single printed circuit board, for example, such as the switches illustrated in U.S. Pat. No. 3,120,583. In this patent a key switch is placed over the printed circuit board. A key is depressed to make contact with various portions of the printed circuit wiring. The keyboard described in this patent is used in conjunction with other equipment and is not necessarily fabricated into the same case or housing. Another example of keyboards used in conjunction with printed circuitry is shown in U.S. Pat. No. 3,600,528. The object of this patent is to provide momentary type switches in large blocks arranged in various configurations and patterns.

DESCRIPTION OF THE INVENTION

This invention involves the design and fabrication of the lower plastic case of an electronic apparatus, for example, a calculator into an electronic chassis. The lower case contains physical accommodations for a cross-bar matrix key switch system that is fabricated on assembly surface. Also mounted on the case is the necessary electronics for a calculator and a display assembly. Battries to operate the calculator on the case surface or fitted into a cavity from the underside which may be provided for this purpose.

The keyboard for the calculator consists of a curve beam switch bus and a contact bus system which together form an array of cross-bar matrix switches. The contact bus portion is a part of the circuit pattern on the assembly surface and the curve beam disk or canterlever switch bus is attached over the contact bus so that upon depression of the switch bus, contact is made with one part of the contact bus system.

The design of the keyboard and chassis arranges the entire electronic assembly on a single surface making it applicable to automatic assembly procedures. By utilizing the lower case as an assembly chassis, the requirement of having separate circuit boards for the different functions is eliminated, thereby, providing an ease of assembly and on a single surface making it applicable to automatic assembly procedures. By utilizing the lower case as an assembly chassis, the requirement of having separate circuit boards for the different functions is eliminated, thereby, providing an ease of assembly and reducing the cost of the over all calculator.

DESCRIPTION OF THE DRAWINGS

For a more complete understanding of the present invention and for features and technical advances provided thereby, reference may now be made to the following description taken into conjunction with the accompanying drawings in which.

DESCRIPTION OF THE PREFERRED EMBODIMENT

Figure 1:
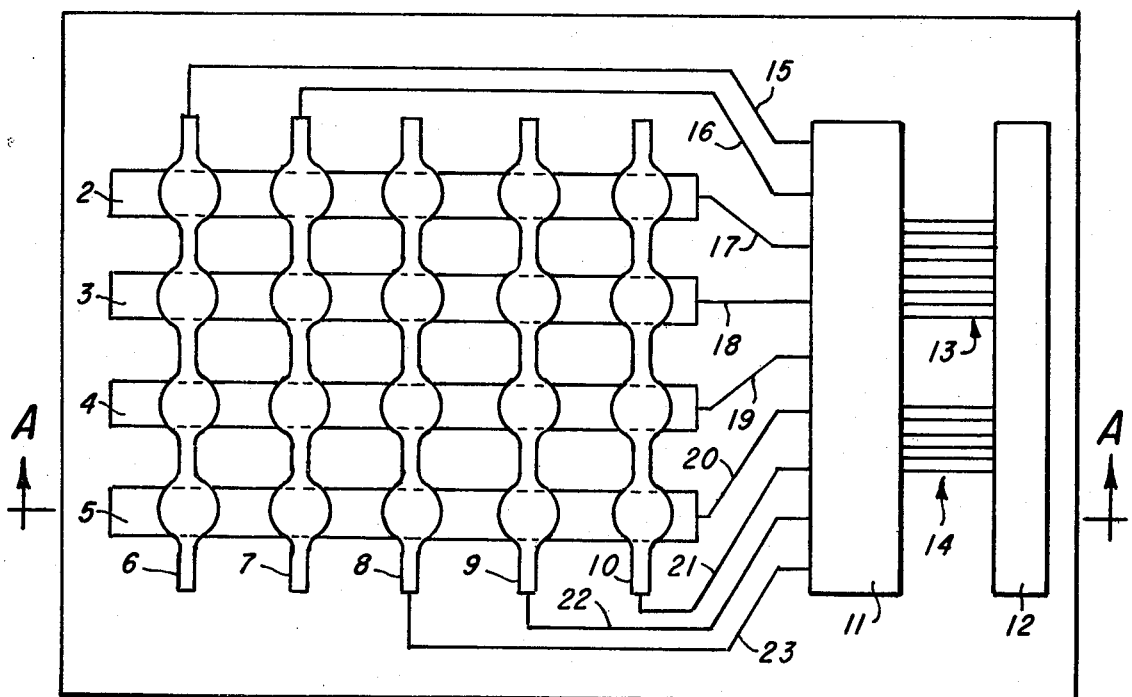
FIG. 1 is the top view of the plastic case illustrating the location of the display, calculator chip and keyboard parts.

FIG. 1 illustrates the top view of one design which may be used at the lower portion of a plastic case for an electronic calculator. Case 1 has formed therein a contact bus system 2,3,4 and 5 which underline a curve beam switch bus system 6,7,8,9 and 10. The contact bus system is formed on the surface of the case or in depressions formed therein, and may be a copper laminate or a deposited metal which had good electrical conducting characteristics. Applied over the contact bus system are the cross-bar matrix key switch which are made from an elastic metal material. The cross-bar matrix key switches may be circular or canterlever beams that extend up away from the contact bus system so that they are not normally in contact therewith. When each key is depressed it makes electrical contact between two mutually perpendicular busses which may be logically recognized as coded input to device 11.

Both the contact bus system and the cross-bar matrix key switches are interconnected with the calculator electronics device 11. The interconnection is made through conductors 15 through 23 which may be in the form of metal stamping, copper laminate or deposited metal on the surface of the plastic case, or may be an extension of the lead frame that is a part of device 11 and may be integral with busses 2,3,4 and 5.

Also mounted on the plastic case is the display 12 which may be any type of display numerals, for example, seven segment numerals commonly used in calculators. There are several types of displays which may be used including light emitting diodes, liquid crystal or other electro-luminescent devices commonly used to display numbers. The display is interconnected with the device 11 through the interconnections 13 and 14, which are of a nature similar to 15 through 23.

Figure 2:
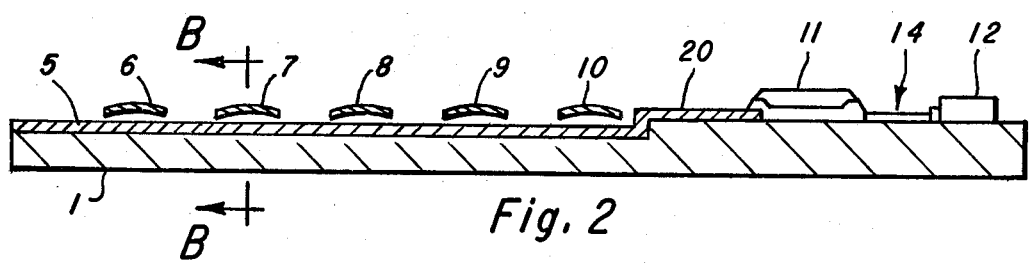
FIG. 2 is a cross-sectional side view of the chassis taken along lines AA.
Figure 3:
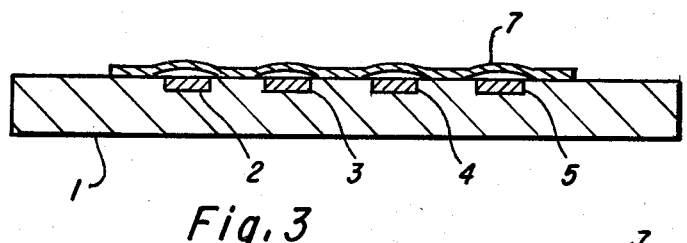
FIG. 3 is a cross-sectional view of the case taken through BB of the case showing FIG. 2.

Looking at FIG. 2, a cross-sectional view of FIG. 1 taken through line AA is shown. It may be observed that the contact bus 5 is recessed into the plastic case with the interconnection 20 lying on the surface of the case and interconnecting the bus 5 and the device 11. The cross-bar matrix key switch is shown raised above the bus bar 5 and normally not in contact therewith.

Another cross-sectional view of the lower plastic case is taken across lines BB of FIG. 2 illustrates how the cross bar matrix key switch system lies on the surface of the plastic case and bridges the contact bus system. Illustrated is the cross bar matrix key switch 7 bridging over the bus contacts 2,3,4 and 5.

Figure 4:
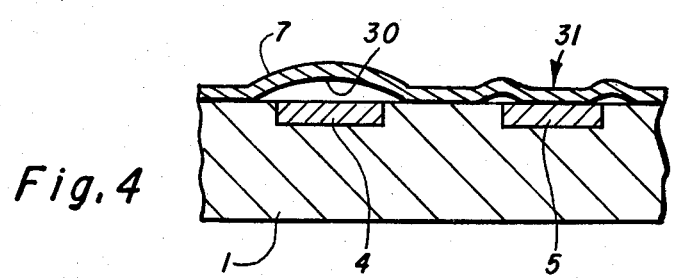
FIG. 4 is a portion of the cross-sectional view of FIG. 3 showing two keys in which one has been depressed making contact with the contact bus system.

The operation of a key is illustrated in FIG. 4. On depressing of one of the keys, illustrated at 31, the metallic surface 30 contacts the bus 15 closing the circuit between bus 5 and cross bar matrix 7 coding an input to the device 11. As an alternate design, the key button may be made as an integral part of the case cover and when a key button is depressed, the cross bar matrix 7 is forced down into contact with a bus for example as shown at 31.

The foregoing embodiment is only one possible design for a combination keyboard, calculator circuit and case. Other basic configurations are possible and various modifications and designs may be made without departing from the scope of the invention as described above and defined in the following claims.

What is claimed is:

1. An integrated electronic assembly comprising: a plastic chassis forming at least a portion of a housing for said assembly, an array of cross-bar matrix switches integrated with the plastic chassis, an integrated circuit device and a display device mounted on said chassis, each of the devices and the matrix switches being electrically interconnected.

2. The integrated electronic assembly according to claim 1 wherein the array of cross-bar matrix switches includes a contact bus system and a curve beam or cantilevered switch bus.

3. The assembly according to claim 2 wherein the contact bus system is formed in the surface of the plastic chassis and the curve beam switch bus is mounted on the plastic chassis and extends over, but not in contact with, the contact bus system.

4. The assembly according to claim 2, wherein the contact bus system is formed on the surface of the plastic chassis and the curve beam switch bus is mounted on the plastic chassis and extends over, but not in contact with, the contact bus system.

5. The integrated electronic assembly defined in claim 1 wherein the integrated circuit device includes a lead frame, wherein the cross-bar matrix switches include a contact bus system and wherein the contact bus system, the interconnections between it and the integrated circuit device and the interconnections between the integrated circuit device and the display device are formed, at least in part, by the lead frame of the integrated circuit device.

6. A calculator comprising:
(a) a plastic base, said base forming at least a portion of a housing for said calculator,
(b) a key switch assembly mounted on said base,
(c) a display device mounted on said base,
(d) electrical conductors affixed directly to said base, and
(e) a calculator electronics device mounted directly on said base and interconnected with said display device and said key switch assembly via said electrical conductors.

7. The calculator according to claim 6 wherein the key switch assembly is comprised of a plurality of metallic conductors in one surface of the plastic base and a plurality of flexible plastic strips extending across, but not in contact with, said metallic conductors, said plastic strips having a conductive material on one surface thereof.

8. The key switch assembly of claim 7 wherein the conductive material on said plastic strips is positioned so that upon applying a compressive force to said strip and one of said metallic conductors a contact is made between said one of said metallic conductors and said conductive material.

9. The calculator according to claim 6, wherein the key switch assembly is comprised of a plurality of metallic conductors on one surface of the plastic base and a plurality of flexible plastic strips extending across, but not in contact with, said metallic conductors, said plastic strips having a conductive material on one surface thereof.

10. The key switch assembly of claim 9, wherein the conductive material on said plastic strips is positioned so that upon applying a compressive force to said strip and one of said metallic conductors, a contact is made between said one of said metallic conductors and said conductive material.

11. The calculator according to claim 6, wherein said electrical conductors are formed by metal deposited on said base.

* * * * *